(12) United States Patent
Matsuda et al.

(10) Patent No.: US 6,494,220 B1
(45) Date of Patent: Dec. 17, 2002

(54) APPARATUS FOR CLEANING A SUBSTRATE SUCH AS A SEMICONDUCTOR WAFER

(75) Inventors: Naoki Matsuda, Kanagawa-ken (JP); Kenya Ito, Kanagawa-ken (JP); Mitsuhiko Shirakashi, Kanagawa-ken (JP)

(73) Assignee: Ebara Corporation, Tokyo (JP)

( * ) Notice: Subject to any disclaimer, the term of this patent is extended or adjusted under 35 U.S.C. 154(b) by 68 days.

(21) Appl. No.: 09/584,091

(22) Filed: May 31, 2000

(30) Foreign Application Priority Data

May 31, 1999 (JP) .......................... 11-151880

(51) Int. Cl.[7] .............................. B08B 3/04
(52) U.S. Cl. ................. 134/104.1; 134/104.2; 134/149; 134/153; 134/182; 134/902; 118/52
(58) Field of Search ............... 134/94.1, 95.1, 134/95.3, 104.1, 104.2, 137, 149, 153, 166 R, 167 R, 182, 198, 201, 902; 118/52

(56) References Cited

U.S. PATENT DOCUMENTS

| | | |
|---|---|---|
| 5,829,156 A | 11/1998 | Shibasaki et al. |
| 6,012,192 A * | 1/2000 | Sawada et al. .......... 134/153 |
| 6,221,157 B1 * | 4/2001 | Davis et al. ............. 118/52 |
| 6,234,949 B1 * | 5/2001 | Cox et al. .............. 494/49 |
| 6,306,455 B1 * | 10/2001 | Takamori et al. .......... 427/8 |

FOREIGN PATENT DOCUMENTS

JP    4-100231    4/1992

* cited by examiner

Primary Examiner—Randy Gulakowski
Assistant Examiner—Joseph Perrin
(74) Attorney, Agent, or Firm—Wenderoth, Lind & Ponack, L.L.P.

(57) ABSTRACT

A cleaning apparatus comprises a holder for holding a substrate such as a semiconductor wafer horizontally and rotating the substrate about its central axis, while conducting a cleaning operation of the substrate by supplying a cleaning liquid thereto. The apparatus further comprises a cleaning vessel including a side wall encircling the substrate rotated by the holder to intercept the cleaning liquid supplied to and scattered from the rotating substrate and then finally drain the cleaning liquid. There is provided a vent duct for carrying gas from the inside of the cleaning vessel to the outside of the same. The vent duct includes an inlet provided at substantially the same level as that of the substrate for introducing the gas into the vent duct. The side wall may include an inner surface along which the cleaning liquid scattered from the substrate flows downward in a spiral manner, with the inner surface, being of a construction which impedes the spiral movement of the liquid in a circumferential or peripheral direction.

13 Claims, 6 Drawing Sheets

US 6,494,220 B1

APPARATUS FOR CLEANING A SUBSTRATE SUCH AS A SEMICONDUCTOR WAFER

BACKGROUND OF THE INVENTION

The present invention relates to a cleaning apparatus for cleaning a substrate, such as a semiconductor wafer or substrate, a liquid crystal panel, and a glass substrate, all of which are required to have a high degree of cleanliness.

With recent rapid progress in technology for fabricating high-integration semiconductor devices, circuit-wiring patterns have been becoming increasingly fink with spaces between wiring patterns also decreasing. Consequently, it is required for semiconductor substrates to be subjected to fine cleaning in such a manner as to remove sub-micron particles from surfaces on which wiring patterns are formed, which particles might otherwise form short circuits between adjacent wiring patterns. Such fine cleaning is also required in processing a glass substrate to be used as a masking member, or a liquid crystal panel or the like.

An apparatus for conducting fine cleaning is generally provided with a rotary substrate holder which holds and rotates a substrate in a horizontal plane, while the substrate is supplied with a cleaning liquid and scrubbed with a brush or sponge member. If fine cleaning is conducted without scrubbing, a cleaning liquid may be supplied in the form of a jet imparted with megasonic or supersonic vibration energy or a jet under high pressure.

The apparatus is further provided with a cleaning vessel which has a side wall and a bottom wall provided at the lower end thereof, and is movable between a raised position where the side wall encircles a substrate held and rotated by the holder to prevent a cleaning liquid supplied to the rotating substrate from scattering, and a lowered position where the substrate holder is exposed or positioned above the vessel to enable the substrate to be replaced with a subsequent one.

In such an apparatus, there is generally provided a means for producing a stream of clean air or inert gas flowing in the cleaning vessel down around the rotating substrate so as to carry out mist of a cleaning liquid, which may be generated during cleaning, from the cleaning vessel through an exit provided in the bottom wall of the vessel, whereby any mist generated is prevented from being deposited on the substrate.

After completion of cleaning, the apparatus continues to rotate the substrate, and in place of the cleaning liquid, an inert gas is supplied to the substrate to effect drying thereof.

The stated apparatus involves the following problem:

In a cleaning operation, a jet of cleaning liquid is directed to either or both of the opposite sides or upper and lower surfaces of a rotating substrate and the liquid supplied to the upper or lower surface is then scattered outside the rotating substrate under centrifugal force whereby it impinges on the inner surface of the side wall of the cleaning vessel. Consequently, a cleaning liquid mist is generated around the substrate, i.e., in areas above and/or below the substrate and adjacent to the inner surface of the side wall of the cleaning vessel. Such a mist is, as stated above, intended to be carried out from the apparatus by a gas stream. However, there is a tendency for some of the mist carried in the gas stream to become deposited on the lower surface of the rotating substrate, around which a negative pressure is generated due to a centrifugal force caused by rotation of the substrate, and/or on the inner surface of the cleaning vessel. Agitation of the gas stream caused by rotation of the substrate increases the tendency of a cleaning liquid mist to become deposited on the lower surface of a rotating substrate. Further, such a mist may arise from a cleaning liquid which flows downward in a spiral manner along the inner surface of the side wall after splashing from the rotating substrate and being intercepted by the inner surface of the side wall of the cleaning vessel. Any mist which has become deposited as described above dries during the drying operation following the cleaning operation, and forms an adhesive residue.

SUMMARY OF THE INVENTION

In view of the above-described circumstances, the present invention is directed to prevention of deposition of a cleaning liquid mist in a cleaning apparatus.

In accordance with the present invention, a cleaning apparatus comprises: a rotary holder for holding a substrate such as a semiconductor wafer horizontally and rotating the substrate about its central axis, while conducting a cleaning operation of the substrate by supplying a cleaning liquid thereto; a cleaning vessel including a side wall encircling the substrate rotated by the rotary holder to intercept the cleaning liquid supplied to and scattered from the rotating substrate and then finally drain the cleaning liquid; and a vent duct for carrying gas from the inside of the cleaning vessel to the outside of the same. The vent duct includes an inlet provided at substantially the same level as that of the substrate for introducing the gas into the vent duct.

In accordance with another aspect of the present invention, a cleaning apparatus comprises: a holder for holding a substrate horizontally and rotating the substrate about its central axis, while conducting a cleaning operation of the substrate by supplying a cleaning liquid to the substrate; a cleaning vessel comprising a side wall encircling the substrate rotated by the holder; and a vent duct for carrying a gas from the inside of the cleaning vessel to the outside of the same. The vent duct includes an inlet provided in the side wall to introduce the gas into the duct.

The cleaning vessel is provided with an inner wall, separated from and located inwardly of the side wall, and surrounding the wafer to intercept the cleaning liquid scattered from the substrate rotated by the holder, and the vent inlet is provided behind the inner wall relative to the substrate.

The vent inlet may be provided in the side wall to fluidly communicate with the inside of the cleaning vessel.

The vent duct may include a duct portion provided on the inner surface of the side wall and extending in a circumferential direction, with the vent inlet provided on the vent duct portion.

In accordance with another aspect of the present invention, a cleaning apparatus comprises a rotary holder for holding a substrate such as a semiconductor wafer horizontally and rotating the substrate about its central axis, while conducting a cleaning operation of the substrate by supplying a cleaning liquid to the substrate; and a cleaning vessel comprising a side wall encircling the substrate rotated by the rotary holder to intercept the cleaning liquid supplied to and scattered from the rotating substrate and then direct the liquid downward. The side wall includes an inner surface along which the cleaning liquid intercepted by the side wall flows downward in a spiral manner. The inner surface is provided with means for impeding the spiral movement of the liquid in a circumferential or peripheral direction.

Specifically, the side wall may be provided with a polygonal cross-sectional configuration. Alternatively, the side wall may be provided on its inner surface with a vertically extending obstacle such as a vertical groove or a vertical ridge which impedes the spiral movement of the cleaning liquid.

The apparatus may further include a nozzle for supplying a liquid to the inner surface of the side wall to prevent the inner surface from being dried.

DETAILED DESCRIPTION OF THE INVENTION

Figure 1:
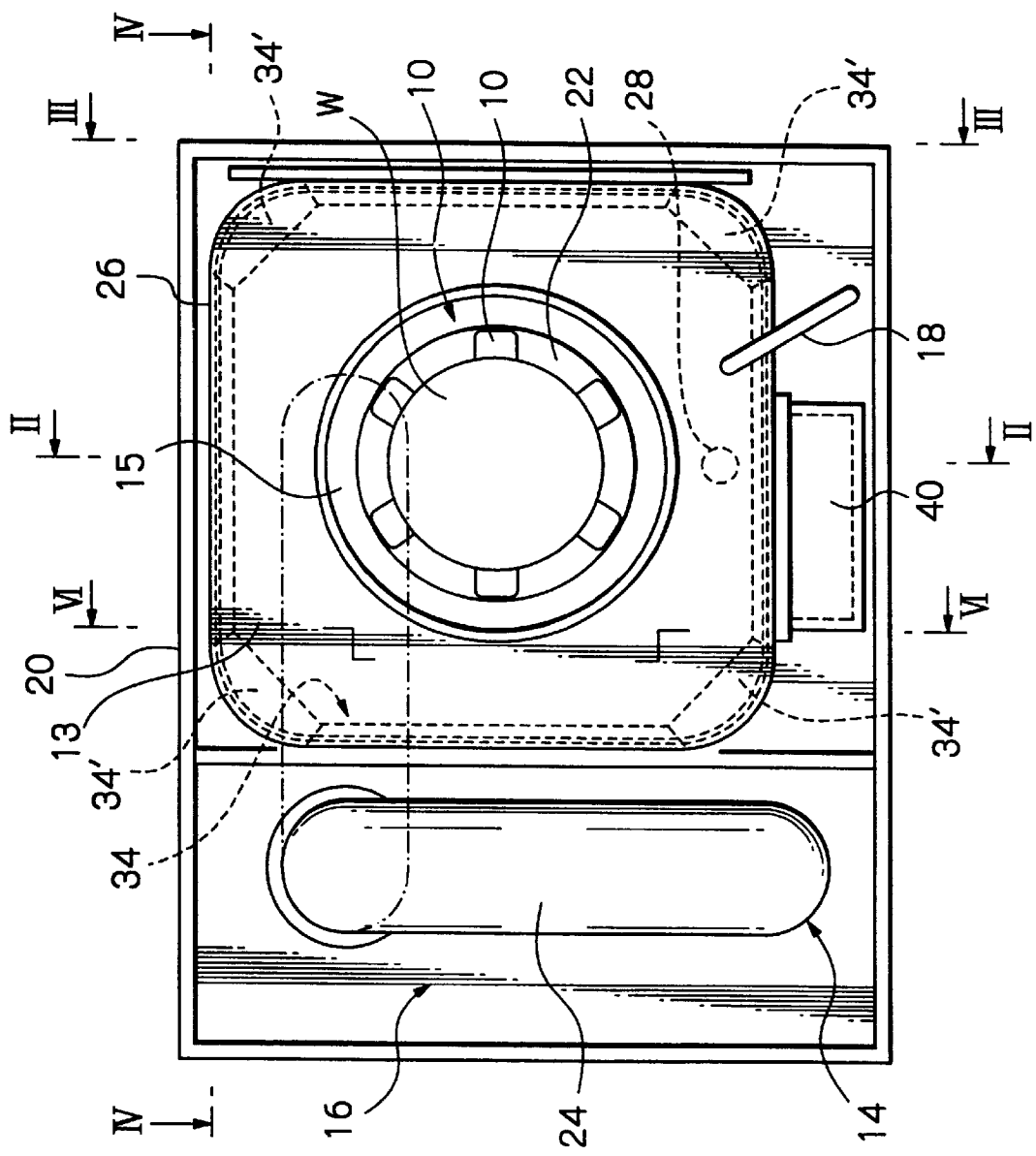
FIG. 1 is a plan view of a cleaning apparatus in accordance with the present invention.

Embodiments of the cleaning apparatus according to the present invention will be described below in detail with reference to FIGS. 1 to 6.

The cleaning apparatus comprises a rotary substrate holder 10 for horizontally holding a semiconductor substrate or wafer W to be cleaned, a motor 12 for drivingly rotating the holder 10, a cleaning liquid supply device 16 having a nozzle 14 for directing a cleaning liquid to the upper surface of the substrate W, a liquid supply nozzle 18 for supplying a liquid such as pure water, a cleaning agent or a gas such as pure nitrogen gas, and a casing 20 covering the above-stated elements. The cleaning liquid may be supplied in the form of, for example, a jet of pure water delivered at a speed sufficiently high to generate cavitation therein when it impinges on the upper surface of the wafer, or a jet of pure water imparted with ultrasonic vibration.

The rotary substrate holder 10 includes a disc 22 secured at the top end of an output shaft 11 of the motor 12 and a plurality of chucks 23 provided on the disc 22, which chucks 23 are adapted to be engaged with the peripheral edge of the wafer W for securely holding the substrate W. The motor 12 rotates the disc 22 about its central axis.

The cleaning liquid supply device 16 includes a pivotal arm 24 which is provided at its distal end with the nozzle 14 and is pivotable about a strut 24' provided at the proximal end thereof between a retracted rest position shown by a solid line in FIG. 1 and a work position wherein the nozzle 14 is positioned over the substrate W held on the holder 10. In a variation of the cleaning liquid supply device 16, the arm 24 is provided at its distal end with a brush, sponge member or the like to be brought into contact with the upper surface of the substrate W in addition to or in place of the nozzle 14 to effect so-called scrub cleaning.

The cleaning apparatus further includes a cleaning vessel 26 provided in the housing 20 and comprises a side wall 26' surrounding the rotary substrate holder 10 and a bottom wall 26". The bottom wall 26" includes a center hole 27 through which the motor output shaft 11 extends vertically and a cleaning liquid discharge port 28 connected to a drainage pipe. The bottom wall 26" is inclined as a whole towards the liquid discharge port 28. The cleaning vessel 26 is connected to a piston/cylinder type actuator 44, whereby the cleaning vessel 26 is moved vertically between a raised position as shown in FIGS. 2–5 and a lowered position where the chucks 23 extend above the top end of the cleaning vessel 26 to enable the substrate W held by the chucks 23 to be replaced with another one. The replacement of wafers is effected through an opening 32 (FIG. 3) formed in the side wall of the casing 20 at the same level as the chucks 23 and which, when the cleaning vessel 26 is at its raised position, is closed by the raised cleaning vessel 26.

Figure 2:
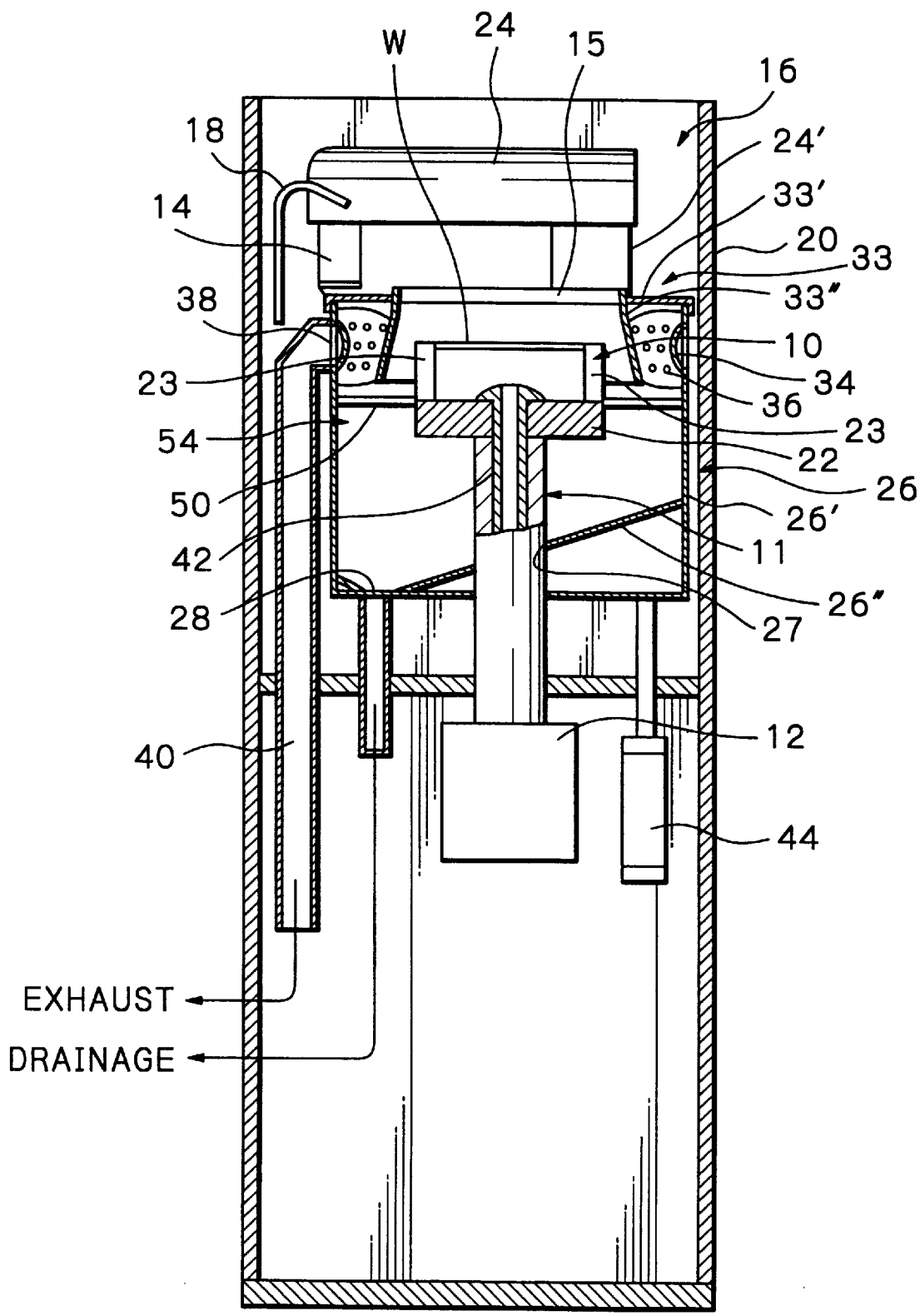
FIG. 2 is a sectional view taken along a line II—II in FIG. 1.
Figure 3:
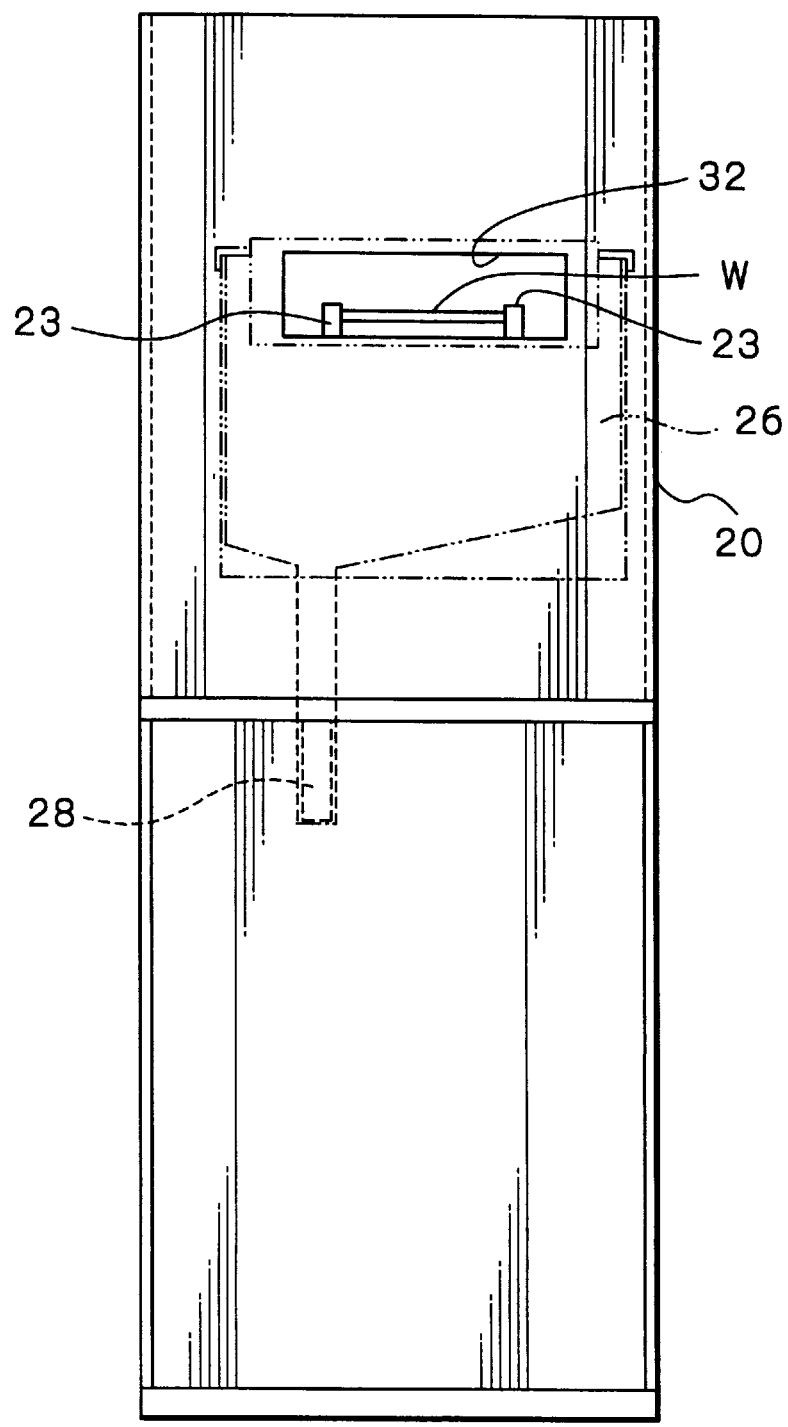
FIG. 3 is a side elevational viewed from a line III—III in FIG. 1.
Figure 4:
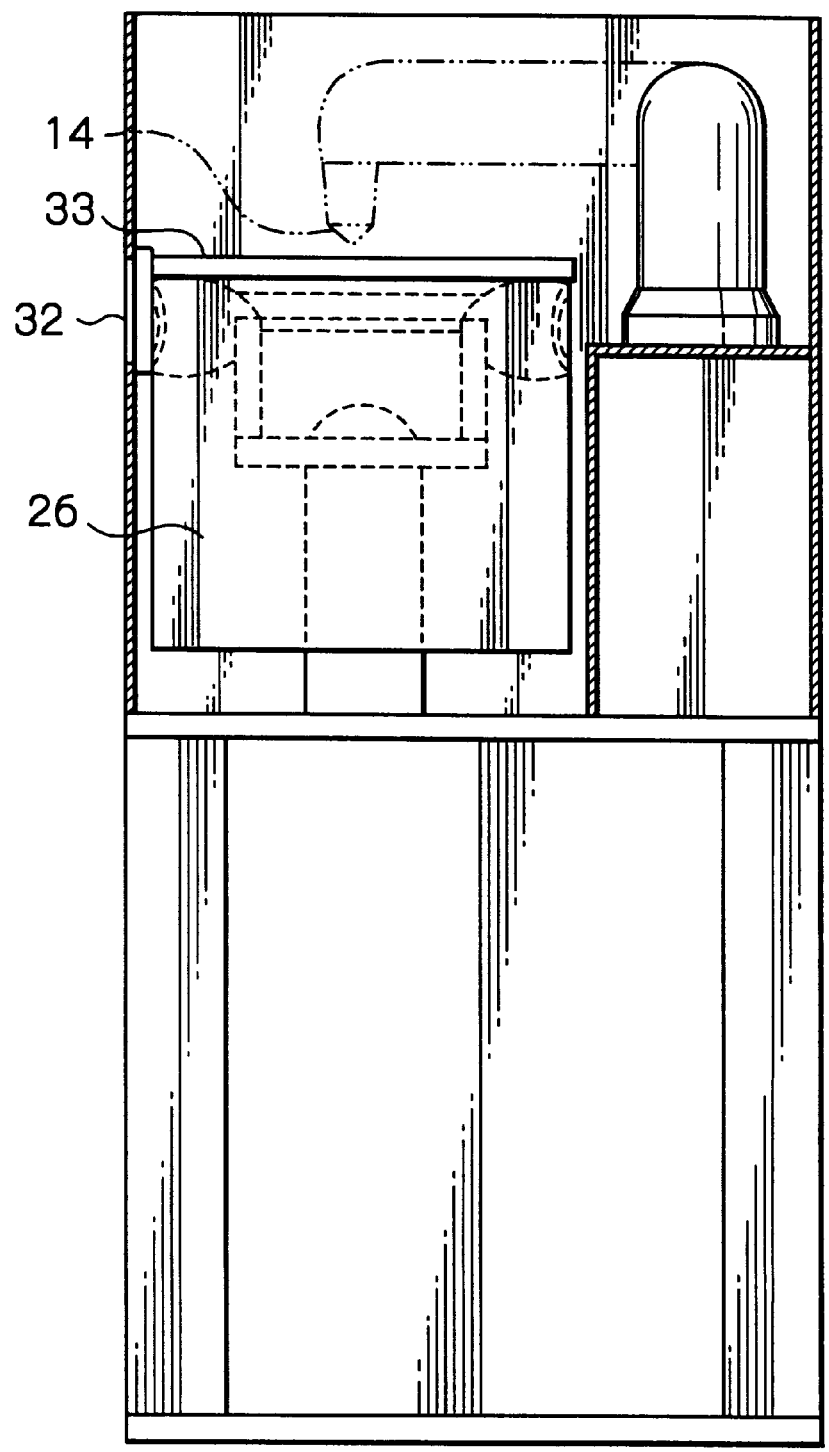
FIG. 4 is a sectional view taken along a line IV—IV in FIG. 1.
Figure 5:
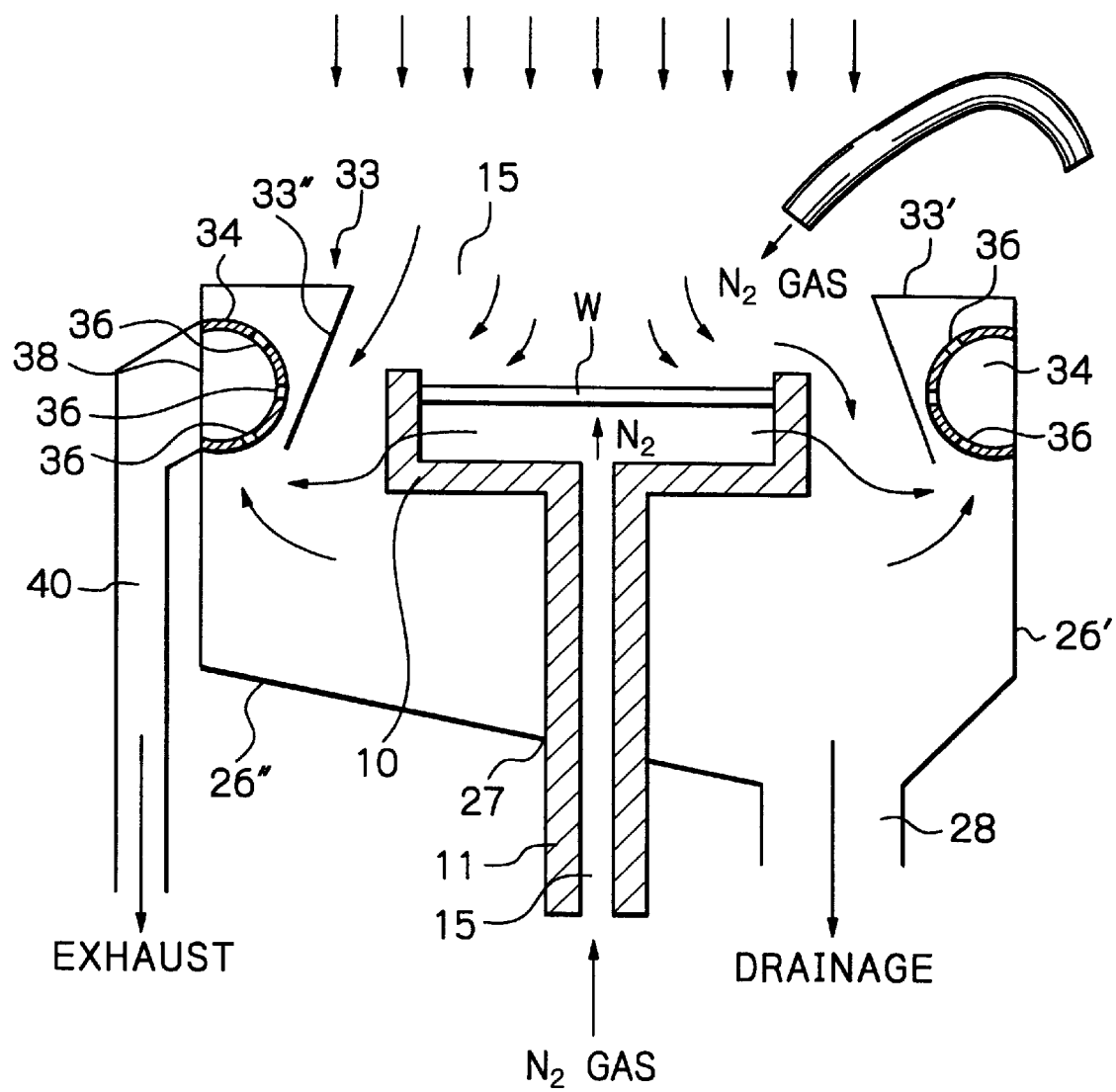
FIG. 5 is a schematic view of the apparatus of FIG. 1 showing a function of the apparatus.
Figure 6:
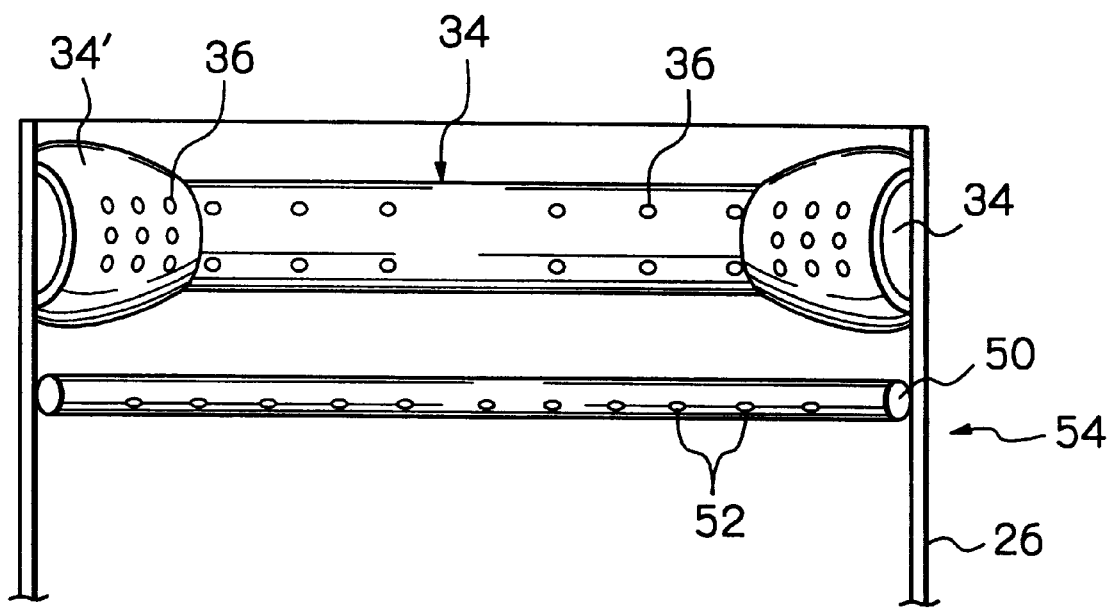
FIG. 6 is a sectional view taken along a line VI—VI in FIG. 1.

As is best shown in FIGS. 2 and 5, the cleaning vessel 26 is provided along its upper peripheral edge with an annular cover 33 including an annular horizontal portion 33' having an outer peripheral edge engaged with the upper peripheral edge of the side wall 26' and an inner peripheral edge defining a central opening 15, and a conical portion or wall 33" extending from the inner peripheral edge of the annular horizontal portion 33'. When the cleaning vessel 26 is positioned at its raised position as shown, the conical wall 33" reaches a level corresponding to that of the wafer W held by the rotary substrate holder 10. Relative to the rotary substrate holder 10, behind the conical wall 33' there is provided a vent duct 34 in the aide wall 26' of the cleaning vessel 26. The vent duct 34 is positioned adjacent to the upper peripheral edge of the side wall 26' and extends in a circumferential direction to assume an annular form. The vent duct 34 is, as best shown in FIGS. 5 and 6, fluidly communicated with the interior of the cleaning vessel 26 through a plurality of vent holes 36 formed in the vent duct 34 and with an external vent duct 40 through a vent opening 38 formed in the side wall 26'. In this embodiment, the side wall 26' is, as seen in a planar view, generally rectangular and the vent duct 34 accordingly assumes a rectangular shape. The vent duct 34 defines corner sections 34' interconnected by an intermediate section. As shown in Fi. 6, a relatively large number of vent holes 36 per unit area is provided in corner sections 34' as compared with the intermediate section that interconnects the corner sections, and accordingly, the vent holes 36 are arranged in the corner sections 34' along a peripheral direction of the vent duct 34 in a non-equal density fashion with respect to the vent holes 36 in the intermediate section.

As shown in FIGS. 2 and 5, the motor output shaft 12 is provided along its central axis with a gas supply pipe 42. The top end opening of the gas supply pipe 42 is directed towards the lower surface of the substrate W held by the holder 10 and the lower end (not shown) is connected to a pure nitrogen gas source with the nitrogen gas jet being directed to the lower surface of the wafer W to prevent any deposition on the surface of a mist of the cleaning liquid. It is possible for the pipe 42 to supply other kinds of liquid such as pure water, a cleaning agent or the like to the lower surface of the substrate W as required.

The side wall 26' of the cleaning vessel 26 is further provided on its inner surface under the vent duct 34 with a drying prevention nozzle 54 including a small diameter pipe 50 extending in a circumferential direction to assume a ring form. The pipe 50 is fluidly connected to a water source (not shown) and includes a plurality of holes 52 directed towards the inner surface of the side wall 26', whereby water is supplied to the inner surface of the side wall 26 to prevent it from being dried.

In operation, the cleaning vessel 26 is first lowered. A robot arm (not shown) supplies a substrate W to be cleaned through the substrate supply opening 32 formed in the casing 20 to the rotary substrate holder 10. When the wafer W is held by the chucks 23 in a horizontal position, the cleaning vessel 26 is raised to the work position, whereby the substrate W held by the holder 10 is surrounded by the side wall 26' of the cleaning vessel 26 and, simultaneously the substrate supply opening 32 is closed by the side wall 26'. A stream of pure gas which flows downward through the cleaning vessel is supplied during the operation.

Next, the motor 12 is actuated to rotate the rotary substrate holder 10 and the pivotal arm 24 of the cleaning liquid supply device 16 is pivoted about the strut 24' so that the nozzle 14 provided at the distal end of the arm 24 directs a jet of cleaning liquid to the upper surface of the rotating substrate W. When cleaning of the wafer W has been completed, supply of the cleaning liquid is halted and, in its place, a rinsing liquid such as pure water is supplied through the nozzle 18 to the upper surface of the rotating wafer W to effect rinsing of the surface. During these operations, a liquid supplied to the upper surface of the substrate W is scattered outside the wafer under a centrifugal force generated by rotation of the wafer and impinges on the conical wall 33 and/or inner surface of the side wall of the cleaning vessel 26. The liquid is finally discharged from the exit opening 28 formed in the bottom wall of the cleaning vessel.

When a liquid impinges on the conical wall 33 and/or the inner surface of the side wall 26', a mist is generated. In this embodiment, the mist is carried by a gas which is drawn into the vent duct 34 through holes 36 positioned at the same level as that of the wafer W, whereby the mist is prevented from being carried by a gas stream flowing down in the cleaning vessel and finally flowing out from the exit hole 28. Accordingly, any likelihood of deposition of the mist on the wafer W greatly decreases.

Further, since the side wall 26' of the cleaning vessel 26 has a rectangular cross section, the movement of the liquid discharged from the rotating substrate W and then spirally flowing down along the inner surface of the side wall 26' is impeded by the corner portions of the side wall 26' so that the component of movement in a circumferential or peripheral direction is depleted in a relatively short time. Consequently, the liquid reaches the exit opening 28 through a short path so that the possibility of generation of the mist from the liquid flowing down along the inner surface of the side wall 26' decreases.

When a predetermined time for rinsing of the substrate W has expired, the supply of rinsing liquid from the nozzle 18 is halted and, in its place, a jet of clear gas such as nitrogen is directed from the nozzle 18 to the center of the substrate W with rotation of the substrate being maintained to effect a spin dry operation. During the drying operation, the vent gas flowing through the vent duct 34 is maintained so that particles of a liquid which may be discharged from the substrate and a mist which may be generated are caused to exit immediately.

Following completion of the drying operation, the cleaning vessel 26 is lowered, and the cleaned and dried substrate W is replaced with a new one by means of the robot arm which operates through the opening 32 formed in the housing.

The drying prevention nozzle 54 supplies water to the inner surface of the side wall 26' of the cleaning vessel 26 to prevent the inner surface from being dried, thereby preventing particles of for example, a cleaning agent from becoming deposited and drying on the inner surface of the side wall.

In this embodiment, the side wall has a rectangular cross section. However, the side wall may have any other form of cross section so long as the form employed can bring about a reduction in speed of a liquid flowing down on the inner surface of the side wall, to thereby reduce a speed component in a circumferential or peripheral direction of the liquid. For example, the cross section configuration of the side wall 26 may be in the form of a triangle, pentagon, or other polygon. The above-stated speed reduction function can be brought about by the provision of vertical ridges, grooves or the like formed on the inner surface of the side wall, with such a provision permitting the side wall to have a circular or oval cross sectional configuration and not a polygonal configuration.

In the embodiment shown in the drawings, vent holes 36 are generally uniformly provided along the entire length of the annular vent duct 34, with a relatively large number of vent holes 36 being provided in the corner portions 34' of the annular vent duct 34. However, the arrangement of the holes 36 may be adapted as required, and the holes may be provided in the form of slits. Further, in place of an annular vent duct, the vent duct may be formed only at the corners of the rectangular side wall 26.

It should be noted that the present invention is not necessarily limited to the foregoing embodiments but can be modified in a variety of ways without departing from the gist of the present invention.

What is claimed is:

1. A cleaning apparatus comprising:
   a holder for holding a substrate and rotating the substrate about its central axis while a cleaning operation is being performed on the substrate by supplying a cleaning liquid to the substrate; and
   a cleaning vessel including a side wall that is to encircle the substrate while the substrate is being rotated by said holder;
   wherein said side wall has a polygonal cross-sectional configuration and a vent inlet is provided in a corner of said side wall to carry a gas from inside of said cleaning vessel to outside of said cleaning vessel.

2. The cleaning apparatus according to claim 1, wherein said side wall has an inner surface and said apparatus further comprises a nozzle for supplying a liquid to said inner surface to prevent said inner surface from being dried.

3. The cleaning apparatus as set forth in claim 1, further comprising a vent duct on said side wall and having vent holes for carrying a gas from inside of said cleaning vessel to outside of said cleaning vessel.

4. The cleaning apparatus according to claim 1, wherein said polygonal cross-sectional configuration comprises a rectangular cross-sectional configuration.

5. A cleaning apparatus comprising:
   a holder for holding a substrate and rotating the substrate about its central axis while a cleaning operation is being performed on the substrate by supplying a cleaning liquid to the substrate;
   a cleaning vessel including a side wall having an inner surface that is to encircle the substrate while the substrate is being rotated by said holder;
   a vent duct for carrying a gas from inside of said cleaning vessel to outside of said cleaning vessel, said vent duct including a vent inlet for introducing the gas into said vent duct; and
   a nozzle for supplying a liquid to said inner surface of said side wall to prevent said inner surface from being dried,
   wherein said inner surface of said side wall is constructed and arranged to allow cleaning liquid scattered from the substrate to flow downwardly in a spiral manner along said inner surface, and said inner surface is also constructed and arranged to impede the spiral movement of the cleaning liquid in a peripheral direction of said side wall.

6. The cleaning apparatus according to claim 5, wherein said side wall has a polygonal cross-sectional configuration.

7. The cleaning apparatus according to claim 5, wherein provided on said inner surface of said side wall is a vertically extending obstacle to impede spiral movement of the cleaning liquid along said inner surface.

8. A clearing apparatus comprising:
- a holder for holding a substrate and rotating the substrate about its central axis while a cleaning operation is being performed on the substrate by supplying a cleaning liquid to the substrate;
- a cleaning vessel including a side wall that is to encircle the substrate while the substrate is being rotated by said holder; and
- a vent duct for carrying a gas from inside of said cleaning vessel to outside of said cleaning vessel, said vent duct including vent inlets in said side wall to introduce the gas into said vent duct,
- wherein said side wall includes an inner surface, with said inner surface of said side wall being constructed and arranged to allow cleaning liquid scattered from the substrate to flow downwardly in a spiral manner along said inner surface, and with said inner surface also being constructed and arranged to impede the spiral movement of the cleaning liquid in a peripheral direction of said side wall.

9. The cleaning apparatus according to claim 8, wherein said vent duct includes corner portions interconnected by an intermediate portion, with said vent inlets being arranged in said corner portions and said intermediate portion along a peripheral direction of said side wall, and with said vent inlets in said corner portions being arranged in a non-equal density fashion with respect to the vent inlets in said intermediate portion.

10. A cleaning apparatus comprising:
- a holder for holding a substrate and rotating the substrate about its central axis while a cleaning operation is being performed on the substrate by supplying a cleaning liquid to the subtrate;
- a cleaning vessel including a aide wall that is to encircle the substrate while the substrate is being rotated by said holder; and
- a vent duct for carrying a gas from inside of said cleaning vessel to outside of said cleaning vessel, said vent duct including vent inlets in said side wall to introduce the gas into said vent duct,
- wherein said side wall has a polygonal cross-sectional configuration.

11. The cleaning apparatus according to claim 10, wherein said vent duct includes corner portions interconnected by an intermediate portion, with said vent inlets being arranged in maid corner portions and said intermediate portion along a peripheral direction of said side wall, and with said vent inlets in said corner portions being arrange in a non-equal density fashion with respect to the vent inlets in said intermediate portion.

12. A cleaning apparatus comprising:
- a holder for holding a substrate and rotating the substrate about its central axis while a cleaning operation is being performed on the substrate by supplying a cleaning liquid to the substrate;
- a cleaning vessel including a side wall that is to encircle the substrate while the substrate is being rotated by said holder; and
- a vent duct for carrying a gas from inside of said cleaning vessel to outside of said cleaning vessel, said vent duct including vent inlets in said side wall to introduce the gas into said vent duct,
- wherein said side wall has an inner surface on which is provided a vertically extending obstacle to impede spiral movement of the cleaning liquid along said inner surface.

13. The cleaning apparatus according to claim 12, wherein said vent duct includes corner portions interconnected by an intermediate portion, with said vent inlets being arranged in said corner portions and said intermediate portion along a peripheral direction of said side wall, and with said vent inlets in said corner portions being arranged in a non-equal density fashion with respect to the vent inlets in said intermediate portion.

* * * * *